United States Patent Office 3,551,154

Patented Dec. 29, 1970

3,551,154

LIGHT SENSITIVE ARTICLE COMPRISING A QUINONE DIAZIDE AND POLYMERIC BINDER

Umberto Di Blas, Gorizia, and Simone Franco, Casalgrasso, Italy, assignors to Ferrania S.p.A., Milan, Italy No Drawing. Filed Dec. 28, 1966, Ser. No. 605,201
Int. Cl. G03c *1/52*
U.S. Cl. 96—91 5 Claims

ABSTRACT OF THE DISCLOSURE

Offset printing positive diazo presensitized matrices containing photosensitive diazo compound and a resin binder which is insoluble in alkaline diazo developer solutions but which is permeable thereto.

The present invention refers to a process for preparing offset printing positive diazo presensitized matrices of improved properties and to the product obtained thereby.

The offset positive presensitized matrices comprise generally a support of different nature (aluminum, zinc, polyester, etc.), made hydrophilic by means of different treatments, and a photosensitive layer comprising either a photosensitive material alone or a photosensitive material and a binder having the purpose of making this photosensitive layer mechanically more resistant.

Of the photosensitive materials, wide application has been found by the sulfonic or carboxylic acid derivatives containing an o-quinone diazide group in an aromatic ring preferably a naphthalene ring. The most used materials include the esters and substituted amides deriving from naphthoquinone - (1,2) - diazide - (2) - 5 - sulfonic acid, naphthoquinone - (1,2) - diazide - (1) - 5 - sulfonic acid and benzoquinonediazide-(2)-p-sulfonic acid.

It is known that these compounds by exposure to light give rise, owing to a photochemical reaction, to products which, unlike the starting materials are soluble in aqueous alkaline solutions. As a result it accrues therefrom that a layer comprising one or more photosensitive materials of the above type, which is per se capable of receiving the usual printing fatty inks, spread on a suitable hydrophilic support, and exposed to light under a transparent original, becomes soluble in the exposed areas and can be therefore removed by aqueous alkaline solutions.

An image is thereby obtained resulting from unexposed areas, in which the layer has not been dissolved by the alkaline solution, and exposed areas, in which the layer has been removed during the development processing, in which the hydrophilic support appears.

The unexposed areas can be inked with printing fatty inks, since they comprise an oleophilic material, whereas the exposed areas, comprising the hydrophilic support, are not inked.

A material of this type can be suitably used as printing matrix in offset printing machines.

In general, the photosensitive materials used alone yield layers which are rather adversely affected by the abrading mechanical action in the printing process.

Therefore, the use has been suggested, of a photosensitive layer comprising a mixture of the sensitive material and an alkali-soluble resin, preferably of the phenol-formaldehyde type, in order to increase the mechanical strength thereof and consequently the printing capacity of the matrix.

The ratio of photosensitive material to binder can range within rather wide limits, depending on the nature of the photosensitive material and the desired properties of the layer, such as, for example, mechanical strength, developability, sensitivity.

It is thus possible to use up to 10 parts by weight of binder to 1 part of diazo compound, the preferred ratios ranging from 6 to 3 parts of binder to 1 part of diazo compound.

It has now been found that offset printing positive presensitized matrices having a photosensitive layer of extremely high mechanical strength can be prepared by using, as binder, together with one or more photosensitive materials, of the quinone diazide class, a resin or a resin mixture not soluble in the alkaline solutions usually employed in diazo-type processes in the developing treatments, but however permeable to said solutions. The developability of said matrices with conventional developing solutions is assured by the decomposed diazo compound.

In particular, the alkali-insoluble, but alkali-permeable resins suitable for the present invention, comprise one or more polymers containing in their molecule recurring carboxylic groups and cross-linked in the layer, by the action of one or more cross-linking agents, said cross-linking agents are chemical compounds capable of reacting with the carboxylic groups of the polymer.

Various polymers containing carboxylic groupings are suitable for use in the preparation of the matrices of the present invention.

For example, the polymers obtained by the copolymerization of a vinylically unsaturated carboxylic acid, such as acrylic and methacrylic, crotonic, maleic and like acids, with one or more ethylenically unsaturated monomers, such as acrylate and methacrylate esters (ethyl acrylate, butyl methacrylate, etc.), vinyl ethers (ethylvinyl ether, butylvinyl ether, phenylvinyl ether, etc.), vinyl esters (vinyl acetate, vinyl propionate, vinyl benzoate, etc.), vinylaromatic monomers (styrene, α-methyl styrene, vinyltoluene, vinyl naphthalene, indene, etc.) acrylic nitriles (acrylonitrile, methacrylonitrile, etc.) vinyl acetate/vinyl monophthalate, vinyl acetate/vinyl monosuccinate, etc. copolymers.

The purpose of this list of polymers is only to better illustrate which compounds in the many, can be usefully employed, it being however understood that it has no limitative character, since any polymer having a sufficient content of free carboxyls capable of reacting with suitable cross-linking agents, can be suitable for the purpose.

The carboxyl content of the polymers suitable for use can range within rather wide limits, depending on the molecular weight, the chemical nature of the polymer, the type and content of the oleophilic moiety, the type of cross-linking agent intended for use, and the cross-linking ratio which one desires to reach. Also the molecular weight of the starting polymers can range within quite wide limits.

As for the cross-linking agents, use can be made of all those compounds capable of reacting with carboxylic groups to give rise to the formation of cross-linking linkages. Particularly suitable are those compounds containing in their molecule two or more isocyanate groups, two or more 1,2-epoxide groups, two or more ethylene imine groups or derivatives thereof, etc.

For example, among the most suitable cross-linking agents mention can be mode of: 2,4-toluylene diisocyanate, 2,6-toluylene diisocyanate, or mixtures thereof, hexamethylene diisocyanate, p,p′-diphenyl methane diisocyanate, 1,5-naphthalene diisocyanate, the condensation product of 1,1,1-trimethylol propane with 2,4-toluylene diisocyanate, p,p′,p″ - triphenyl methane triisocyanate, polyvinyl isocyanate, etc., polyglycidyl methacrylate, copolymers of glycidyl methacrylate with acrylate or vinyl esters or with aromatic vinyl monomers, etc., triethylene imino phosphine oxide, trimethyl ethylene imino phosphine oxide, sym. triethylene imino triazine, acryloyl ethylene imine homopolymers and copolymers or mixture of one or more of these.

Not necessarily the cross-linking agent is used in stoichiometric ratios to the available carboxyls. Usually, on the contrary, not all the carboxylic groups are involved in the cross-linking reaction, but a portion thereof is let free in order to enhance the permeability of the layer to the alkaline developer.

The percentage of carboxyls not involved in the reaction with the cross-linking agent can vary depending on the type of polymer, particularly on the content and nature (the more or less oleophilic) of the comonomer, the type of diazo-oxide employed, the diazo-oxide/binder ratio, the type of cross-linking agent, etc. Or, all the carboxyls present in the binding resin can be involved in the cross-linking reaction; this is the case for example when the polymer contains in its molecule other groupings which secure thereto the required permeability to the developer (such for example as lactam groupings, etc.) or when the cross-linking agent itself introduces groupings which impart to the layer the required permeability to the developer (for example hydrophilic groups formed as a result of the cross-linking reaction, etc.). However, the cross-linking ratio can vary also depending on the type of developing solution employed, particularly on the pH of said solution.

The matrices of the present invention are preferably prepared by dissolving in an organic solvent one or more photo-sensitive materials of the o-quinone diazide class, one or more polymers containing in their molecule a suitable number of free carboxylic groups, one or more cross-linking agents and then spreading said solution by one of the known methods usually employed for spreading thin layers.

The cross-linking agent is preferably added to the diazo compound and binder solution just before the spreading, but it can be added at any other stage.

Sometimes the cross-linking reaction takes place in the layer at room temperature. However, it is preferable to keep the spread material at temperature values higher than room temperature and, as a matter of course, at a temperature lower than the decomposition temperature of the diazo compound which has been employed, in order to accelerate the cross-linking of the binder. This fact has in addition the advantage of stabilizing the material, permitting the completion of the cross-linking reaction to be readily attained, thus avoiding a working out in the time of the material. In this connection it can be advisable to use temperatures higher than room temperature already in the drying stage of the layer.

The property of greater mechanical strength of the layer comprising a photosensitive derivative of the quinone diazide class and employing as binder alkali-insoluble, but alkali-permeable cross-linked resins of the type hereinabove described, reflects in a greater printing capacity of these matrices in comparison with those employing as binders the usual alkali-soluble resins.

In order to better illustrate the essence of the invention, general schemes of preparation of some classes of polymers and their properties, and some examples of preparation of the matrices are set forth hereinbelow, it being, however, understood that they shall not be construed as a limitation to the scope of the invention.

PREPARATION AND PROPERTIES OF SOME POLYMERS

(A) Vinyl acetate-vinyl monophthalate copolymer 50 g. of commercial polyvinyl alcohol (88% saponification) were suspended in 250 ml. of glacial acetic acid and added with 108 ml. of acetic anhydride and 1 g. of sodium acetate. The whole was then heated at 248.0° F. (120° C.) during 3–4 hours, after that the resulting solution was cooled at 176.0° F. (80° C.), added with 54 g. of phthalic anhydride and maintained at 176.0° F. (80° C.) for 30 hours. The solution thus obtained was cooled and the polymer precipitated in water, filtered off and dried under vacuum. The product obtained thereby was redissolved in 300 ml. of methanol and reprecipitated in water. After drying under vacuum, about 70 g. of a product containing 3.9% of free COOH groups were recovered.

Viscosity=1.33 cps. at 77.0° F. (25° C.) for a 2% solution in DMF (N,N-dimethylformamide).

Solubility=readily soluble in dioxan and DMF and alcohol, insoluble in water, soluble in a NaOH aqueous solution.

CROSS-LINKING RUNS (a) With epoxides—0.59 of a polymer were dissolved in 10 ml. of dioxan, added with 0.2 g. of polyglycidyl methacrylate (obtained according to the teachings set forth in applicant's English Pat. No. 1,022,206, Example 2), dissolved in 5 ml. of acetone. The resulting solution was then poured on a watch-glass and evaporated to dryness. The film thus obtained was then heated in a stove at 140.0° F. (60° C.) for 8 hours in order to facilitate the cross-linking reaction. In this way a film was obtained which swelled without dissolving in aqueous NaOH even at boil.

(b) With ethylene imine cross-linking agent—0.5 g. of polymer were dissolved in 10 ml. of dioxan, added with 0.1 g. of triethyleneimine phosphine oxide and evaporated to dryness on a watch-glass. The film obtained after heating at 122.0° F. (50° C.) for 5 hours, swelled, without dissolving in N NaOH and DMF, both in the cold and in the hot.

(c) With isocyanates—0.5 g. of polymers were dissolved in 10 ml. of dioxan, added with 0.2 g. of a 2,4- and 2,6-toluylene diisocyanate mixture dissolved in 5 ml. of methylethyl ketone. After evaporation to dryness, the film was kept at 131.0° F. (55° C.) during 4 hours, after that it became quite insoluble in alkalis and organic solvents.

(B) Ethyl acrylate-acrylic acid copolymer 20 ml. of freshly distilled ethyl acrylate and 3 ml. of distilled acrylic acid were heated at reflux for 5 minutes in 80 ml. of acetone, added with 1 g. of α,α'-azo-bis-isobutyronitrile and kept at reflux for 5 hours.

The resulting solution was cooled and poured in water under vigorous stirring. The polymer thus obtained was recovered by decantation, repeatedly washed with water, then dried under vacuum at 122.0° F. (50° C.).

Yield=19.5 g.

COOH content=7.6%.

Viscosity=2.25 cps. at 77.0° F. (25° C.) for a 2% solution in DMF.

Solubility=soluble in acetone, methylethyl ketone, dioxan, 0.5 N NaOH; insoluble in $H_2O$.

CROSS-LINKING RUNS (a) With epoxides—1 g. of polymer dissolved in 15 ml. of acetone, was added with 0.3 g. of a glycidyl methacrylate copolymer containing 70% of glycidyl methacrylate (obtained by free-radical polymerization by means of α,α'-azo-bis-isobutyronitrile in acetone solution at reflux, under the usual conditions). The resulting solution was evaporated to dryness on a watch-glass and the film thus obtained was heated at 140.0° F. (60° C.) for 10 hours, after that it tended to swell without dissolving in a 5% sodium hydroxide solution or in organic solvents.

(b) A similar run was carried out by using as cross-linking agent hexamethylene diisocyanate, with successful result.

(c) A similar cross-linking run, with successful result, was carried out by using an ethylene imine cross-inking agent.

(C) Acrylonitrile-methacrylic acid copolymers 30 ml. of distilled acrylonitrile and 5 ml. of methacrylic acid were heated at reflux for 5 minutes in 100 ml. of acetone, added with 3 g. of α,α'-azo-bis-isobutyronitrile and heated at reflux for 20 hours. Upon completion of this step, the whole mass was cooled and poured in ethyl ether under good stirring; the product which separated was washed with ether and dried under vacuum.

Yield=31 g.
COOH=10.1%.
Solubility=soluble in DMF, 2% sodium hydroxide, insoluble in $H_2O$.
Viscosity=1.75 cps. at 77.0° F. (25° C.) for 2% solution in DMF.

CROSS-LINKING RUNS (a) With epoxides—0.5 g. of polymers were dissolved in 10 ml. of DMF and added with 0.2 g. of a glycidyl methacrylate-butyl acrylate copolymer containing 59% of glycidyl methacrylate (obtained by free-radical polymerization by means of α,α'-azo-bis-isobutyronitrile in acetone solution at boil and recovery of the polymer under the usual conditions), dissolved in acetone. The solution was then evaporated to dryness on a watch-glass and the film thus obtained was heated in a stove at 131.0° F. (55° F.) for 6 hours. A film was thus obtained which swelled but which was insoluble in 2% NaOH in water even in the hot.

(b) A similar cross-linking run was carried out by using as cross-linking agent diphenylmethane-4,4'-diisocyanate.

(c) A similar cross-linking run was carried out by using as cross-linking agent triethylene imino phosphine oxide, with successful result.

(D) Vinyl acetate-acrylic acid copolymer 30 ml. of vinyl acetate and 7 ml. of freshly distilled acrylic acid were heated at reflux for 5 minutes in 100 ml. of acetone. Then 3 g. of α,α'-azo-bis-isobutyronitrile were added and heating was continued for 20 hours. At the close of this time, the whole was poured in water and the product was washed repeatedly with water and then dried under vacuum.

Yield=21.5 g.
COOH=7.2%.
Viscosity=1.12 cps. at 77.0° F. (25° C.) for a 2% solution in DMF.
Solubility=soluble in DMF, dioxan, 3% NaOH; insoluble in $H_2O$.

CROSS-LINKING RUNS (a) With isocyanates—0.5 g. of polymer were dissolved in 10 ml. of DMF and added with 0.2 g. of 2,4-toluylene diisocyanate. The resulting solution was then evaporated to dryness on a watch-glass and the film thus obtained was heated at 131.0° F. (55° C.) for 10 hours. A film insoluble in 5% NaOH even at boil was obtained.

(b) With epoxides—a similar cross-linking run was carried out with successful result by using, as cross-linking agent, a glycidyl methacrylate copolymer.

(c) With ethylene imine cross-linking agents—a similar run was carried out by using trimethyl ethylene imino phosphine oxide as cross-linking agent.

(E) Vinyl acetate-crotonic acid copolymer

Commercial product.
COOH content=3.8%.
Viscosity=1.88 cps. at 77.0° F. (25.0° C.) for a 2% solution in dioxan.
Solubility=readily soluble in acetone, methylethyl ketone, dioxan, DMF, 2% sodium hydroxide; insoluble in $H_2O$.

CROSS-LINKING RUNS (a) With epoxides—0.5 g. of polymer were dissolved in 10 ml. of dioxan added with 0.2 g. of polyglycidyl methacrylate dissolved in acetone and evaporated to dryness on a watch-glass. The film thus obtained was heated in a stove at 131.0° F. (55.0° C.) for 10 hours, after that it is swellable in 2% NaOH in water, but insoluble.

(b) A similar cross-linking run was carried out by using a triisocyanate as cross-linking agent.

(c) A similar cross-linking run was carried out with sucessful result by using one of the above ethylene imine cross-linking agents.

(F) Vinyl acetate-methacrylic acid copolymer

Commercial product.
COOH content=3%.
Viscosity=2.26 cps. at 77.0° F. (25° C.) for 2% solution in dioxan.
Solubility=soluble in acetone, methylethyl ketone, dioxan ethylene dichloride, 2% NaOH in water; insoluble in $H_2O$.

CROSS-LINKING RUNS (a) With epoxide cross-linking agents—1 g. of polymer dissolved in acetone (15 ml.) was added with 0.2 g. of butyl acrylate-glycidyl methacrylate copolymer dissolved in 10 ml. of acetone.

The solution was then evaporated to dryness on a watch-glass and the film thus obtained was heated at 149.0° F. (65.0° C.) for 5 hours, after that its solubility was tested. The film was swellable but quite insoluble in 3% NaOH and in dioxan, even at boil.

(b) With diisocyanates—a similar cross-linking run was carried out by using as cross-linking agent diphenyl-4,4'-diisocyanate.

(c) With ethylene imine cross-linking agents—under conditions similar to those referred to hereinabove, a cross-linking run was carried out by means of sym. triethyleneimine triazine.

EXAMPLES OF PREPARATION OF MATRICES

Example 1

20 g. of a vinyl acetate-crotonic acid copolymer described at the point (E) above were dissolved in 150 ml. of dioxan, added with 5 g. of a photosensitive material such for example as the ester of naphthoquinone-(1,2)-diazido-(2)-5-sulfonic acid with p-tert.-butylphenol and 150 ml. of an acetone solution containing 10 g. of polyglycidyl methacrylate (obtained according to the teachings reported in applicant's English Pat. No. 1,022,-206, Example 2).

The solution was then spread by any of the methods known on an aluminum support suitably degreased and grained by mechanical brushing, and then dried in a ventilating cage at 176.0–194.0° F. (80–90° C.), as to obtain a dry layer having a covering of about 2.5 g./sq.m.

The sensitive material thus obtained was then kept in a stove at 131.0° F. (55.0° C.) for 8 days, in order to complete the cross-linking reaction. Thereafter a specimen was exposed, by placing it behind a transparent original, and then developed with a 6% trisodium phosphate aqueous solution.

A matrix was thus obtained having a relief image of excellent properties and good ink receptivity.

Example 2

25 g. of a vinyl acetate-crotonic acid copolymer, of the point (E) dissolved in 350 ml. of dioxan, were added with 5 g. of the photosensitive material of the naphthoquinone diazide class of Example 1, and then with 5 g. of trimethyl ethylene imine phosphine oxide.

The resulting solution was then spread on a suitably treated aluminum support and then dried at 176.0–194.0° F. (80–90° C.) so as to obtain a dry film having a covering of 2.3 g./sq.m. After keeping for 3 days at 131.0° F. (55° C.), a specimen of this material was exposed behind a transparent original and then developed with a 3% trisodium phosphate aqueous solution. A relief image of excellent properties and good ink receptivity was obtained.

Example 3

25 g. of the vinyl acetate-vinyl monophthalate copolymer of point (A) were dissolved in 350 ml. of dioxan added with 5 g. of the above photosensitive material and 5 g. of a 75% solution of a triisocyanate obtained by condensation of 1,1-trimethylol propane with 2,4-toluylene diisocyanate. The solution thus obtained was spread on an aluminum support and then dried at 176°–194.0° F. (80–90° C.) so as to obtain a dry layer having a covering of 2.2–2.4 g./sq.m.

After drying in a stove at 131.0° F. (55° C.) for 6 days, in order to complete the cross-linking reaction, the material was exposed in the usual way and developed with one of the usual commercially available developing solutions, comprising sodium phosphate and silicate.

A relief image of excellent properties and good ink receptivity was obtained.

Example 4

29 g. of a vinyl acetate-vinyl monophthalate copolymer obtained by a process similar to that described at point (A), but having a COOH content of 5.6% were dissolved in 300 ml. of dioxan added with 5 g. of the above photosensitive material and with 0.6 g. of triethylene imine phosphine oxide.

The solution thus obtained was spread on a suitably processed aluminum support and dried so as to obtain a covering as a dry layer, of 2.3–2.6 g./sq.m. After drying at 131.0° F. (55° C.) for 10 days, the material was exposed in the usual way and developed with one of the commercially available developing solutions comprising sodium phosphate and silicate. A relief image of excellent properties and good ink receptivity was obtained.

Example 5

20 g. of the vinyl acetate-vinyl monophthalate copolymer of point (A) were dissolved in 250 ml. of dioxan, added with 5 g. of the above photosensitive material and with 0.6 g. of a glycidyl methacrylate copolymer containing about 75% of glycidyl methacrylate. The solution thus obtained was spread on a suitable aluminum support and dried in the usual way. The covering obtained was of about 2.5 g./sq.m.

After drying for 5 days at 131.0° F. (55.0° C.) in order to complete the cross-linking, the material was exposed in the usual way and developed with a 3% trisodium phosphate water solution. An image of excellent properties and good ink receptivity was obtained.

Example 6

20 g. of the vinyl acetate-crotonic acid copolymer of point (E), and 5 g. of the above photosensitive material were dissolved in 300 ml. of dioxan and added with 10 g. triethylene-imino phosphine oxide. The solution thus obtained was spread on a suitable aluminum support by one of the usual methods. After drying for 7 days at 131.0° F. (55.0° C.), a specimen of the material thus obtained was exposed in the usual way and developed with the developer of the composition given in Example 1.

An image of excellent properties and good ink receptivity was obtained.

Example 7

25 g. of the vinyl acetate-methacrylic acid copolymer of point (F) dissolved in 300 ml. of dioxan, were added with 5 g. of the above photosensitive material and with 5 g. of polyglycidyl methacrylate. The resulting solution was then spread on a suitable aluminum support by one of the usual methods.

After drying for 5 days at 140.0° F. (60.0° C.) a specimen of the material thus obtained was exposed in the usual way and developed with a 3% trisodium phosphate water solution.

An image of excellent properties and good ink receptivity was obtained.

Example 8

By following the procedure described in the preceding example, a matrix was prepared but by using as cross-linking agent 5 g. of a glycidyl methacrylate-butyl acrylate containing 73% of glycidyl methacrylate.

Example 9

25 g. of the vinyl acetate-crotonic acid copolymer of point (E) and 5 g. of the usual photosensitive material were dissolved in 300 ml. of dioxan and added with 10 g. of glycidyl methacrylate-butyl acrylate copolymer containing 59% of epoxide monomer.

The solution thus obtained was then spread on a suitable aluminum support by one of the methods known. After drying and exposure, a specimen of the material was developed with one of the developers known, obtaining an image of excellent properties.

Example 10

12.5 of the acrylonitrile-methacrylic acid copolymer of point (C) dissolved in 300 ml. of DMF were added with 5 g. of the usual photosensitive diazo compound and with 2.5 g. of a glycidyl methacrylate-butyl acrylate copolymer containing 73% of epoxide monomer. The solution thus obtained was spread on a suitable aluminum support and dried in the usual way. The covering obtained was of about 2.5 g./sq.m. After drying at 131.0° F. (55.0° C.) for 5 days in order to complete the cross-linking, the material was exposed in the usual way and developed with a 3% trisodium phosphate aqueous solution. An image of excellent properties and good ink receptivity was obtained.

Example 11

By following the procedure of the preceding example a matrix was prepared, but using as resin an ethyl acrylate-acrylic acid copolymer prepared by a process similar to that referred at point (B), but with a COOH content of 12.46%.

An image of good properties was obtained.

Example 12

12.5 g. of the ethyl acrylate-acrylic acid copolymer of point (B) and 5 g. of the usual photosensitive material, were dissolved in 300 ml. of DMF and added with 3.5 g. of a glycidyl methacrylate-butyl acrylate copolymer containing 59% of glycidyl methacrylate. The resulting solution was spread on a suitable aluminum support by the known method, so as to obtain a dry layer with a covering of 2.4 g./sq.m.

After drying for one week at 131.0° F. (55.0° C.), a specimen of the material was exposed and developed with a trisodium phosphate solution in the usual way.

An image of good properties was obtained.

Example 13

56 g. of the vinyl acetate-crotonic acid copolymer of point (E) were dissolved together with 10 g. of the usual photosensitive diazo-compound in 400 ml. of dioxan and added with 4.3 g. of naphthalene-1,5-diisocyanate.

The solution thus obtained was then spread on a suitable processed aluminum support. After drying for one week at 131.0° F. (55.0° C.), a specimen of the material was exposed in the usual way and developed with a 3% trisodium phosphate aqueous solution. An image of excellent properties and good ink perceptivity was obtained.

Example 14

An offset printing matrix was prepared by following the procedure of the preceding example, but using as cross-linking agent diphenyl-methane-4,4'-diisocyanate. An image of good properties was obtained.

Example 15

By following the procedure of the preceding examples, a matrix was prepared by using as binder the vinyl acetate-acrylic acid copolymer of point (D) and as cross-linking agent a glycidyl methacrylate-butyl acrylate copolymer containing 59% of glycidyl methacrylate.

After the usual treatment of accelerated drying, exposure and development, a relief image of excellent properties and good ink receptivity was obtained.

Example 16

67 g. of the vinyl acetate-crotonic acid copolymer of point (E) were dissolved in 1000 ml. of dry dioxan, added with 13.5 g. of the usual photosensitive material and with 15.5 g. of a 75% solution of a triisocyanate obtained by condensation of 1,1,1-trimethylol propane with 3,4-toluylene diisocyanate. The solution thus obtained was then spread on a suitably processed aluminum support and then dried at 176.0–194.0° F. (80–90° C.) so as to obtain a dry layer having a covering of 2.2–2.4 g./sq.m.

After drying at 140.0° F. (60.0° C.) for 5 days, the material was exposed in the usual way and developed with usual alkaline solutions. An image of excellent properties and good ink receptivity was obtained.

Example 17

76 g. of the vinyl acetate-crotonic acid copolymer of point (E) were dissolved in 1000 ml. of dry dioxan and then added with 27 g. of the usual photosensitive diazocompound and with 33 g. of a 20% solution of 4,4',4''-triphenylmethane triisocyanate in methylene dichloride.

The resulting solution was spread in the usual way. The material after drying at 140.0° F. (60.0° C.) for 5 days, was exposed and developed in the customary way.

An image of excellent properties and good ink receptivity was obtained.

Various other embodiments of the present invention will be apparent to those skilled in the art without departing from the scope thereof.

The embodiments of the invention in which an exclusive property or privilege is claimed as defined as follows:

1. A positive, light-sensitive element having a support and a light-sensitive layer, said layer comprising a photosensitive aromatic o-quinone diazide compound and a polymeric binder having recurring carboxyl groups wherein at least a portion of said carboxyl groups has been reacted with a cross-linking agent selected from the group consisting of compounds containing two or more isocyanate groups, compounds containing two or more 1,2-epoxide groups, and compounds containing two or more ethylene imine groups, to cross-link and thereby render said binder insoluble in but permeable to alkaline solution; said polymeric binder being a copolymer of an ethylenically unsaturated carboxylic acid and an ethylenically unsaturated monomer.

2. The element of claim 1 wherein the ratio of said aromatic o-quinone diazide compound to binder is from 1/1 to 1/10.

3. The element of claim 1 wherein said cross-linking occurs by reaction of said carboxyl groups with a compound containing three isocyanate groups in the molecule, said compound being a condensation product of 1,1,1-trimethylol propane and 2,4-toluylene diisocyanate.

4. The element of claim 1 wherein said cross-linking occurs by reaction of said carboxyl groups with a glycidyl methacrylate polymer.

5. The element of claim 1 wherein said cross-linking occurs by reaction of said carboxyl groups with triethylene imino phosphine oxide.

References Cited

UNITED STATES PATENTS

| | | | |
|---|---|---|---|
| 3,050,387 | 8/1962 | Neugebauer et al. | 96—91X |
| 3,208,850 | 9/1965 | Daech | 96—91 |
| 3,244,523 | 4/1966 | Growald et al. | 96—91X |
| 3,298,833 | 1/1967 | Gaynor | 96—75 |
| 2,746,863 | 5/1956 | Kosalek et al. | 96—91 |
| 2,772,972 | 12/1956 | Herrick et al. | 96—91 |
| 2,990,281 | 6/1961 | Printy et al. | 96—35.1 |
| 3,032,414 | 5/1962 | James et al. | 96—91 |
| 3,231,374 | 1/1966 | Sciombi | 96—115X |
| 3,278,305 | 10/1966 | Lavidon et al. | 90—35.1 |
| 3,357,831 | 12/1967 | Wu | 96—35.1 |
| 3,402,044 | 9/1968 | Steinhoff et al. | 96—91D |
| 2,948,706 | 8/1960 | Schellenberg et al. | 96—115UX |

FOREIGN PATENTS

| | | | |
|---|---|---|---|
| 850,954 | 10/1960 | Great Britain | 96—91 |
| 975,456 | 11/1964 | Great Britain | 96—49 |

OTHER REFERENCES

Kosar, J. "Light Sensitive Systems," August 1965, pp. 250–251 relied on.

NORMAN G. TORCHIN, Primary Examiner

C. BOWERS, Assistant Examiner